(12) United States Patent
Mochizuki (10) Patent No.: US 10,042,226 B2
(45) Date of Patent: Aug. 7, 2018

(54) DISPLAY DEVICE

(71) Applicant: Japan Display Inc., Minato-ku (JP)

(72) Inventor: Kazuhide Mochizuki, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/422,986

(22) Filed: Feb. 2, 2017

(65) Prior Publication Data

US 2017/0219862 A1 Aug. 3, 2017

(30) Foreign Application Priority Data

Feb. 2, 2016 (JP) .................................. 2016-018185

(51) Int. Cl.
| | | |
|---|---|---|
| *H01L 27/32* | (2006.01) | |
| *G02F 1/1343* | (2006.01) | |
| *G02F 1/1368* | (2006.01) | |
| *G02F 1/1362* | (2006.01) | |
| *H01L 29/423* | (2006.01) | |

(52) U.S. Cl.
CPC ...... *G02F 1/1368* (2013.01); *G02F 1/136209* (2013.01); *G02F 1/136227* (2013.01); *G02F 1/136286* (2013.01); *H01L 29/42384* (2013.01); *G02F 2001/13685* (2013.01)

(58) Field of Classification Search
None
See application file for complete search history.

(56) References Cited

U.S. PATENT DOCUMENTS

| | | | | |
|---|---|---|---|---|
| 9,310,658 | B2* | 4/2016 | Lee | G02F 1/13624 |
| 2010/0128192 | A1* | 5/2010 | Kim | G02F 1/134363 |
| | | | | 349/46 |
| 2014/0312351 | A1* | 10/2014 | Shiomi | H01L 27/124 |
| | | | | 257/72 |
| 2015/0198850 | A1* | 7/2015 | Tasaka | G02F 1/1368 |
| | | | | 349/46 |
| 2015/0248030 | A1* | 9/2015 | Yamazaki | G02F 1/13454 |
| | | | | 349/43 |
| 2016/0377918 | A1* | 12/2016 | Yamazaki | G02F 1/133555 |
| | | | | 257/72 |

FOREIGN PATENT DOCUMENTS

JP    11-84421    3/1999

* cited by examiner

*Primary Examiner* — Sitaramarao S Yechuri
(74) *Attorney, Agent, or Firm* — Oblon, McClelland, Maier & Neustadt, L.L.P.

(57) ABSTRACT

According to one embodiment, a display device includes first and second source lines arranged along a first direction, a gate line including first and second portions arranged along a second direction intersecting the first direction, and a connection portion which connects the first portion and the second portion to each other and a semiconductor layer which intersects at least one of the first portion and the connection portion, and each of the first portion and the second portion intersects the first and second source lines and the connection portion is located between the first source line and the second source line.

17 Claims, 7 Drawing Sheets

DISPLAY DEVICE

CROSS-REFERENCE TO RELATED APPLICATIONS

This application is based upon and claims the benefit of priority from Japanese Patent Application No. 2016-018185, filed Feb. 2, 2016, the entire contents of which are incorporated herein by reference.

FIELD

Embodiments described herein relate generally to a display device.

BACKGROUND

Display devices such as liquid crystal displays and organic electroluminescence (EL) display devices comprise various wiring lines including gate lines, source lines, etc. which are connected to switching elements and the like, which drive pixels.

In recent years, as the definition of the display device is improved, the number of wiring lines such as gate lines and source lines is increasing. On the other hand, for displaying moving images, for example, pixels are sometimes driven at a high frequency of about 120 Hz. For this reason, in order to achieve both a high definition and a high driving frequency, it is necessary to write signals in many wiring lines at high frequency, which creates a tendency of shortening the signal write-in time.

Moreover, in order to suppress the decrease in the aperture ratio, which may be caused by the wiring lines the number of which is increasing, the width of the lines is reduced, which also creates a tendency of increasing the electric resistance of the wiring lines.

Thus, signals need to be written in the wiring lines of high resistance in a short time, and therefore it is difficult to write a signal to each line normally, which may cause degradation in display quality.

DETAILED DESCRIPTION

In general, according to one embodiment, a display device comprises first and second source lines arranged along a first direction, a gate line including first and second portions arranged along a second direction intersecting the first direction and a connection portion which connects the first portion and the second portion to each other, and a semiconductor layer which intersects at least one of the first portion and the connection portion, each of the first portion and the second portion intersects the first and second source lines, and the connection portion is located between the first source line and the second source line.

According to another embodiment, a display device comprises first, second and third source lines arranged along a first direction, and a gate line including first and second portions arranged along a second direction intersecting the first direction and a first connection portion and a second connection portion which connect the first portion and the second portion to each other, the first connection portion is located between the first source line and the second source line, and the second connection portion is located between the second source line and the third source line.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc. of the respective parts are schematically illustrated in the drawings, compared to the actual modes. However, the schematic illustration is merely an example, and adds no restrictions to the interpretation of the invention. Besides, in the specification and drawings, the same elements as those described in connection with preceding drawings are denoted by like reference numerals, and a detailed description thereof is omitted unless otherwise necessary.

First Embodiment

Figure 1:
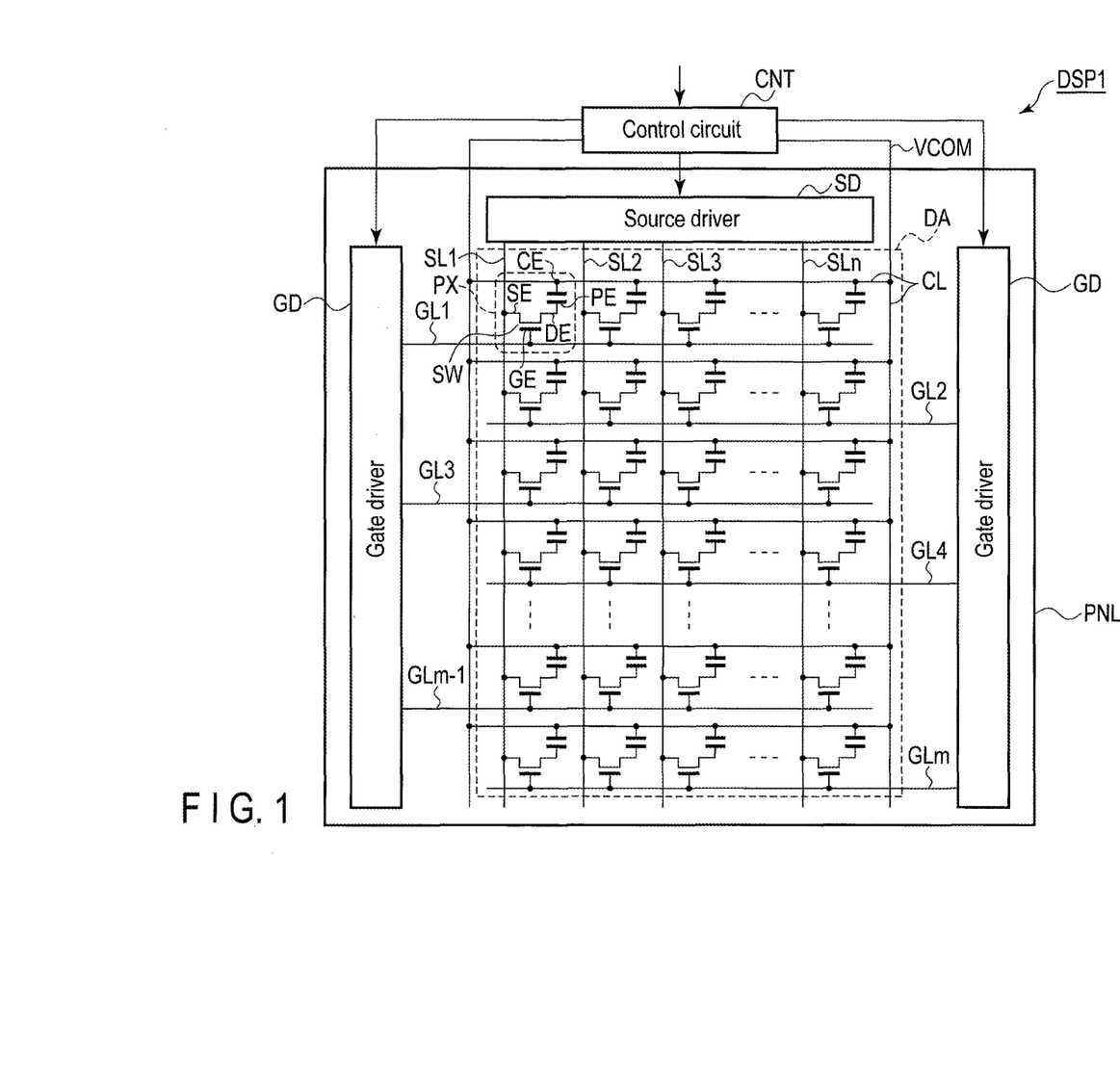
FIG. 1 is a circuit diagram schematically showing an example of a display device according to the first embodiment.

FIG. 1 is a circuit diagram schematically showing an example of a display device DSP1 according to the first embodiment. In this embodiment, the display device is a liquid crystal display device comprising a liquid crystal layer. However, no limitation is intended thereby, and the display device DSP1 may be any type of display device including a self-luminous display device such as an organic electroluminescence (EL) display device, or an electronic paper display device comprising an electrophoretic element.

The display device DSP1 comprises an active-matrix-type display panel PNL and a driving unit which supplies signals for displaying images on the display panel PNL.

The display panel PNL is, for example, a liquid crystal display panel which holds a liquid crystal layer between a pair of substrates. The display panel PNL includes a display area DA where images are displayed. The display area DA comprises a plurality of pixels PX arrayed in a matrix. The display panel PNL comprises, in the display area DA, a plurality of gate lines GL (GL1 to GLm) for selecting respective pixels PX, a plurality of source line SL (SL1 to SLn) for supplying image signals to the respective pixels PX, a common line CL which supplies a common potential (VCOM) to a common electrode CE, which will be described later. Note that m and n represent positive integers.

The driving unit comprises gate drivers GD, a source driver SD and a control circuit CNT. The gate drivers GD and the source driver SD are at least partially formed in the display panel PNL. The control circuit CNT is provided in a drive IC chip, a flexible printed circuit board (not shown) or the like, which are mounted in the display panel PNL.

Each of the gate lines G is drawn to the outside of the display area DA and is electrically connected to a respective gate driver GD. Each of the source lines SL is drawn to the outside of the display area DA and is electrically connected to the source driver SD. Peripheral circuits such as the gate drivers GD and source driver SD each comprise an N-type thin-film transistor, a P-type thin-film transistor, a complementary-type thin-film transistor in which an N type and a P type are combined, or the like, though will not be described in detail.

Each pixel PX comprises a switching element SW, a pixel electrode PE, a common electrode CE, etc. The switching element SW is formed from, for example, an N-type thin-film transistor. The switching element SW comprises a gate electrode GE, a source electrode SE and a drain electrode DE. The gate electrode GE is connected to the respective gate line GL. For example, the source electrode SE is connected to the respective source line SL. For example, the drain electrode DE is connected to the respective pixel electrode PE.

A capacitance is formed between each of the pixel electrode PE and the common electrode CE, and thus an image signal (voltage) necessary for display on each respective pixel PX is retained therein. The common electrode CE is connected to the control circuit CNT via the common line CL. Note that the example illustrated is described in connection with the case where a common potential is supplied from the control circuit CNT to the common electrode CE, but the embodiment is not limited to this example. Besides the control circuit CNT, there may be a drive circuit which supplies the common potential.

The control circuit CNT generates various signals necessary to display images in the display area DA based on an external signal supplied from an external signal source, and outputs them to each of the gate driver GD and the source driver. Further, the control circuit CNT applies a common potential (VCOM) to the common electrode CE.

The gate driver GD supplies a scanning signal to each of the gate lines GL. The source driver SD supplies an image signal to each of the source lines SL. The switching elements SW connected to the same gate line GL are switched over between the connection and non-connection states based on the scanning signal supplied to the respective gate line GL.

The image signal supplied to a source line SL when the switching element SW is in the connection state is supplied to the respective pixel electrode PE through the respective switching element SW. Here, an electric field is produced according to the potential difference between the pixel electrode PE and the common electrode CE. Alignment of the liquid crystal molecules contained in the liquid crystal layer is controlled by the electric field produced between the pixel electrode PE and the common electrode CE. An image signal written in a pixel PX is held by the capacitance between the respective pixel electrode PE and common electrode CE until the following image signal is written therein.

The display panel PNL of this embodiment may be of a transmissive type having a transmissive display function, displays images by selectively transmitting light from its rear side, a reflective type having a reflective display function, which displays images by selectively reflecting light from the front side, or a trans-reflective type having both the transmissive display function and the reflective display function.

Moreover, although a detailed explanation of the structure of the display panel PNL is omitted here, the display panel PNL may have such a structure that corresponds to a display mode using a lateral electric field along a main surface of the substrate, a display mode which uses a vertical electric field perpendicular to the main surface of the substrate, a display mode using an oblique electric field inclined to the main surface of the substrate, or a display mode using a combination of these. In the display mode using a lateral electric field, such a structure is applicable, that both the pixel electrode PE and the common electrode CE are provided on one substrate which constitutes the display panel PNL. In the display mode using a vertical electric field or an oblique electric field, such a structure is applicable, that the pixel electrode PE is provided on one substrate constitutes the display panel PNL, and the common electrode CE is provided on the other substrate.

Figure 2:
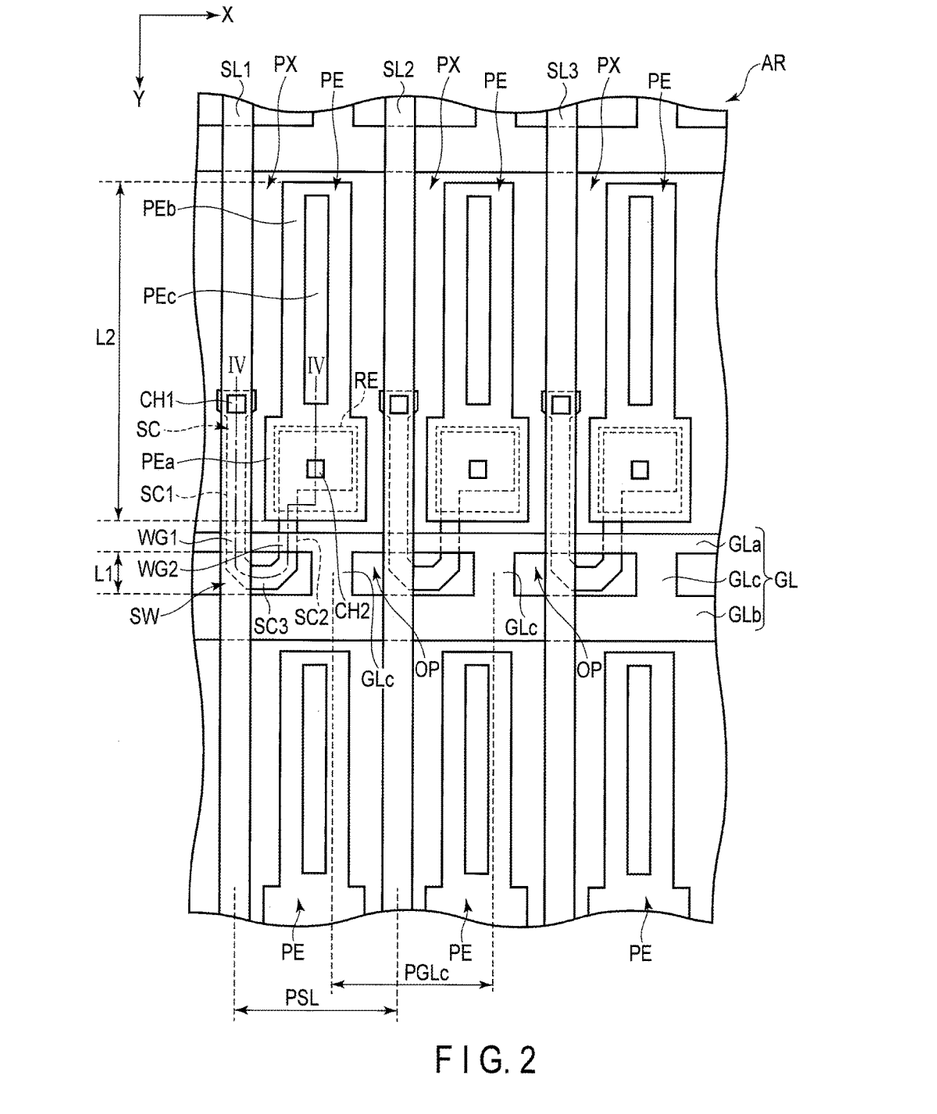
FIG. 2 is a plan view showing an example of a wiring pattern of the display device according to the first embodiment.

FIG. 2 is a plan view partially showing an example of the pixel pattern of the display panel PNL shown in FIG. 1. Here, a plan view of an array substrate AR, which is one substrate which constitutes the display panel PNL, is shown. In this figure, the first direction X and the Y second direction intersect each other. Note that the first direction X and the second direction Y intersect at right angles in this example, but they may intersect at an angle other than 90 degrees. The main surface of the substrate is a surface parallel to an X-Y plane defined by the first direction X and the second direction Y.

The example illustrated corresponds to a case where a fringe field switching (FFS) mode, which is one of the display modes using a lateral electric field is used. Note that FIG. 2 shows only the principal part of three pixels PX arranged along the first direction X, and illustration of the insulating film, common electrode, light-shielding film, etc. is omitted. The pixel PX illustrated here has a rectangular shape with short sides along the first direction X and long sides along the second direction Y. The shape of the pixel PX is not limited to rectangular, but may be changed as needed.

The array substrate AR comprises a gate line GL, source lines SL1 to SL3, switching elements SW, pixel electrodes PE, etc. The gate line GL is formed into a ladder shape. More specifically, the gate line GL includes a first portion GLa, a second portion GLb and a connection portion GLc. The first portion GLa and the second portion GLb each have substantially a fixed width therealong, and are extended in the first direction X. The first portion GLa and the second portion GLb are arranged along the second direction Y. The first portion GLa is located on a side more close to the pixel electrode PE than to the second portion GLb. The first portion GLa includes the first gate electrode WG1 and the second gate electrode WG2 of the respective switching element SW. The connection portion GLc is extended along the second direction Y in each pixel PX and connects the first portion GLa and the second portion GLb to each other.

The source lines SL1 to SL3 are each extended along the second direction Y and arranged along the first direction X. The source lines SL1 to SL3 each intersect the first portion GLa and the second portion GLb. The connection portion GLc is located between an adjacent pair of source lines SL. In other words, the connection portions GLc and the source lines SL are arranged alternately along the first direction X.

Note that in the example illustrated, the source lines SL and the gate lines GL are each extended linearly, but they may be bent.

The pixel electrodes PE are arranged in a matrix along the first direction X and the second direction Y. The first portion GLa and the second portion GLb are located between two adjacent pixel electrodes PE along the second direction Y. An interval L1 between the first portion GLa and the second portion GLb along the second direction Y is less than a length L2 of the pixel electrode PE along the second direction Y. In other words, no pixel electrode PE intervenes between the first portion GLa and the second portion GLb. Further, the connection portion GLc is located between two adjacent pixel electrodes PE along the second direction Y.

The gate line GL includes an opening OP elongated along in the first direction X between two adjacent connection portions GLc. In the example illustrated, the opening OP has a rectangular shape. Along the first direction X, a pitch PGLc of the connection portions GLc is equal to a pitch PSL of the source lines SL. Here, the pitch PGLc of the connection portions GLc is equivalent to a distance between the centers of two adjacent connection portions GLc along the first direction X. Similarly, the pitch PSL of the source lines SL is equivalent to a distance between the centers of two adjacent source lines SL along the first direction X.

The three pixels PX illustrated are identical to each other in configuration, and therefore, the configuration thereof will be described in detail by focusing the pixel PX located between the source lines SL1 and SL2. In the pixel PX, the switching element SW is arranged near the intersection of the first portion GLa of the gate line GL and the source line SL1. The switching element SW is a double-gate thin film transistor including the first gate electrode WG1 and the second gate electrode WG2. That is, the semiconductor layer SC which constitutes the switching element SW includes two regions which overlap the first portion GLa of the gate line GL.

More specifically, the semiconductor layer SC is formed into, approximately, a U-letter shape, and includes a first region SC1, a second region SC2 and a third region SC3.

The first region SC1 is extended along the second direction Y under the source line SL1 and intersects the first portion GLa, but does not intersect the second portion GLb. The first region SC1 is electrically connected to source line SL1 by its one end side through a contact hole CH1, and the other end side is located between the first portion GLa and the second portion GLb. The first gate electrode WG1 is equivalent to the region of the first portion GLa, which intersects the first region SC1.

The second region SC2 is extended along the second direction Y from between source line SL1 and the connection portion GLc toward the pixel electrode PE and intersects the first portion GLa, but does not intersect the second portion GLb. One end side of the second region SC2 is expanded and electrically connected to the pixel electrode PE through a contact hole CH2 and a relay electrode RE, and the other end side is located between the first portion GLa and the second portion GLb. The second gate electrode WG2 is equivalent to the region of the first portion GLa, which intersects the second region SC2. The connection portion GLc is located between the second region SC2 and the source line SL2.

The third region SC3 is located between the first portion GLa and the second portion GLb, and extended along the first direction X to connect the first region SC1 and the second region SC2 to each other. The third region SC3 overlaps the opening OP.

The pixel electrode PE includes a contact portion PEa and an electrode portion PEb. The contact portion PEa overlaps the relay electrode RE and is electrically connected to the relay electrode RE through openings 15a and 16a and CEa, which will be explained in detail later. The electrode portion PEb is extended from the contact portion PEa along the second direction Y. The electrode portion PEb includes a slit opening PEc along the second direction Y. The electrode portion PEb may include a plurality of openings PEc, but which may be omitted.

In the gate line GL of this embodiment, the width of the first portion GLa is determined by the channel length of the switching element SW. The width of the second portion GLb can be determined as needed according to the width of the region which does not overlap the semiconductor layer SC or pixel electrode PE, and can be made greater than that of the first portion GLa. On the other hand, expansion of the width of the second portion GLb leads to expansion of the pitch between adjacent pixels PX along the second direction Y, or reduction of the length of the pixel PX along the second direction Y. Under these circumstances, it is preferable to determine the width of the second portion GLb within such an extent to be able to achieve the resistance required as the gate line GL.

Note that in the example illustrated, one connection portion GLc is provided in one pixel PX, but a plurality of connection portions may be provided as well.

Figure 3:
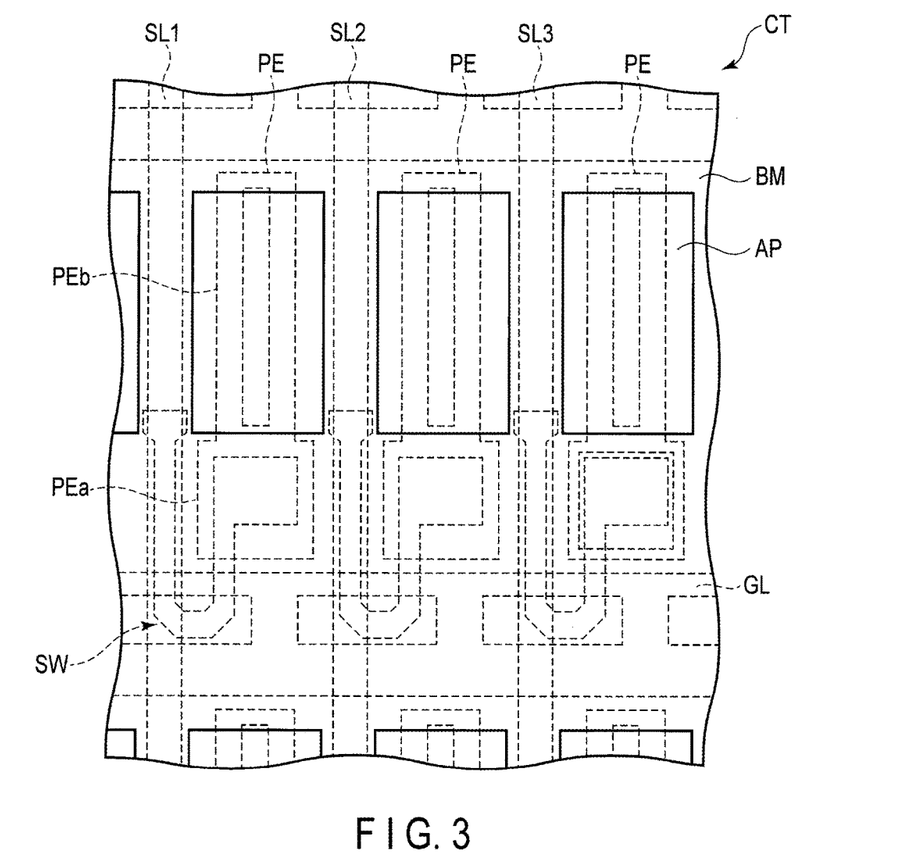
FIG. 3 is a plan view showing a pattern of a light-shielding film of the display device according to the first embodiment.

FIG. 3 is a plan view showing an example of the region in which a light-shielding film BM which partitions into pixels PX is formed. Here, a plan view of a counter-substrate CT, which is another substrate which constitutes the display panel PNL, is shown. Note that the main part of the array substrate AR shown in FIG. 2 is illustrated with the dotted line.

The light-shielding film BM is arranged so as to overlap the source line SL, the gate line GL and the switching element SW. Further, the light-shielding film BM is arranged to overlap the contact portion PEa of the pixel electrode PE and partition into the pixels PX. That is, the light-shielding film BM includes an opening AP which exposes the electrode portion PEb of the pixel electrode PE. The opening AP corresponds to the region which substantially contributes to display.

Figure 4:
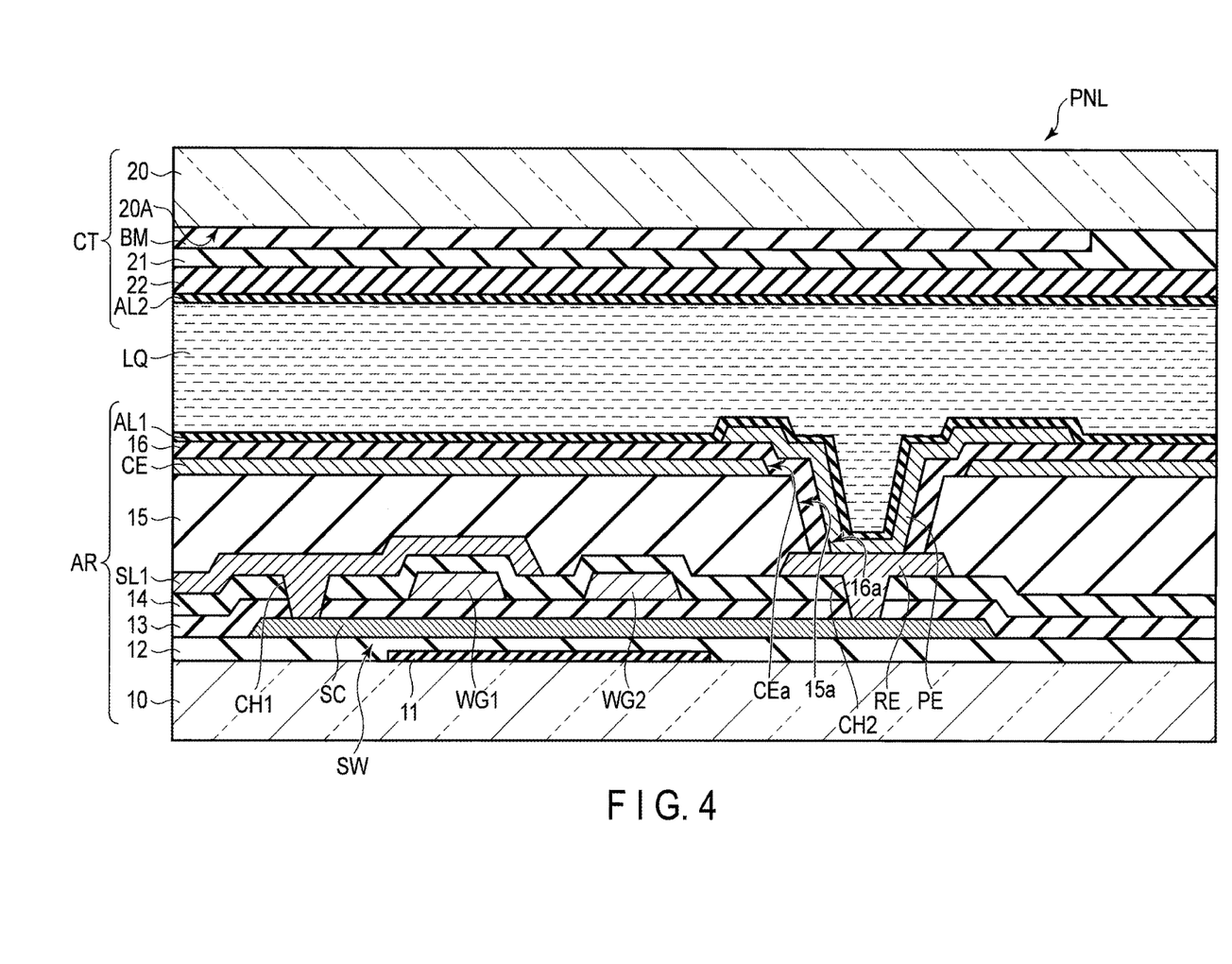
FIG. 4 is a cross section taken along line IV-IV in FIG. 2.

FIG. 4 is a cross section of the display panel PNL taken along line IV-IV shown in FIG. 2.

The display panel PNL comprises the array substrate AR, the counter-substrate CT and the liquid crystal layer LQ. The counter-substrate CT opposes the array substrate AR. The liquid crystal layer LQ is held between the array substrate AR and the counter-substrate CT.

The array substrate AR comprises a first insulating substrate 10, a light-shielding layer 11, first to fifth insulating films 12 to 16, a switching element SW, a common electrode CE, a pixel electrode PE, a first alignment film AL1, and the like.

The first insulating substrate 10 is formed from, for example, an insulating material such as glass or resin. The light-shielding layer 11 is formed on the first insulating substrate 10. The light-shielding layer 11 shields light towards the semiconductor layer SC from the backlight unit (not shown). The first insulating film 12 is formed to cover the light-shielding layer 11 and also on the first insulating substrate 10.

The semiconductor layer SC, which constitutes the switching element SW, is formed on the first insulating film 12. The semiconductor layer SC is formed from, for example, polycrystalline silicon. The semiconductor layer SC may be formed from, for example, some other silicon-based material such as amorphous silicon, or an oxide semiconductor containing an oxide of at least one of indium (In), gallium (Ga), zinc (Zn) and tin (Sn), for example. When the semiconductor layer SC is formed of an oxide semiconductor, the light-shielding layer 11 may be omitted.

The second insulating film 13 is formed to cover the semiconductor layer SC and also on the first insulating film 12.

The first gate electrode WG1 and the second gate electrode WG2 are formed on the second insulating film 13. Note that the light-shielding layer 11 should preferably be located in a region directly under the semiconductor layer SC, which opposes the first gate electrode WG1 and the second gate electrode WG2.

The third insulating film 14 is formed to cover the first gate electrode WG1 and the second gate electrode WG2 and also on the second insulating film 13. The first to third insulating films 12 to 14 are formed from, for example, an inorganic insulating material such as silicon oxide or silicon nitride.

The source line SL1 and the relay electrode RE are formed on the third insulating film 14. The source line SL1 is connected to one end portion of the semiconductor layer SC via the contact hole CH1 made through the third insulating film 14 and the second insulating film 13. The relay electrode RE is connected to the other end portion of the semiconductor layer SC via the contact hole CH2 made through the third insulating film 14 and the second insulating film 13.

The fourth insulating film 15 is formed to cover the source line SL1 and the relay electrode RE and also on the third insulating film 14. An opening 15a is formed in a region of the fourth insulating film 15, which overlaps the relay electrode RE. The fourth insulating film 15 is formed of, for example, an organic insulating material such as a transmissive resin.

The common electrode CE is formed on the fourth insulating film 15. The common electrode CE includes an opening CEa. The opening CEa is formed above the opening 15a and has a size slightly greater than that of the opening 15a.

The fifth insulating film 16 is formed to cover the common electrode CE and also on the fourth insulating film 15. The fifth insulating film 16 is formed of, for example, silicon nitride. In a bottom of the opening 15a, an opening 16a is formed in the fifth insulating film 16, so as to expose the relay electrode RE.

The pixel electrode PE is formed on the fifth insulating film 16, a portion of the pixel electrode PE which is formed in the opening 16a is connected with the relay electrode RE.

The fifth insulating film 16 and the pixel electrode PE are covered by the first alignment film AL1.

Meanwhile, the counter-substrate CT comprises a second insulating substrate 20, a light-shielding film BM, a color filter 21, an overcoat layer 22, a second alignment film AL2 and the like. The second insulating substrate 20 is formed from, for example, an insulating material such as glass or resin. The light-shielding layer BM is formed on an inner surface 20A of the second insulating substrate 20, which opposes the array substrate AR, and partitions into pixels PX as described with reference to FIG. 3. The color filter 21 is formed on the inner surface 20A and partially overlaps the light-shielding layer BM. The color filter 21 is disposed on the opening OP of each pixel PX shown in FIG. 3. Although will not be explained in full detail, the color filter 21 is formed of a resin material colored in red, green, blue or the like. The overcoat layer 22 covers the color filter 21. The overcoat layer 22 is formed of a transparent resin material. The overcoat layer 22 is covered by the second alignment film AL2.

The array substrate AR and the counter-substrate CT configured as described above are arranged so that the first alignment film AL1 and the second alignment film AL2 oppose each other and attached each other with a sealing material (not shown). A liquid crystal composition containing liquid crystal molecules is sealed between the first alignment film AL1 of the array substrate AR and the second alignment film AL2 of the counter-substrate CT, thus forming a liquid crystal layer LQ.

The first alignment film AL1 and the second alignment film AL2 are subjected to an alignment treatment to be aligned in the same direction in a plane parallel to the main surfaces of the first insulating substrate 10 and the second insulating substrate 20. Therefore, in a state where an electric field is not formed between the pixel electrode PE and the common electrode CE, the liquid crystal molecules contained in the liquid crystal layer LQ are set in an initial alignment in an alignment direction of the first alignment film AL1 and the second alignment film AL2. On the other hand, in a state where an electric field is formed between the pixel electrode PE and the common electrode CE, the liquid crystal molecules are aligned in a direction different from that of the initial alignment.

Figure 5:
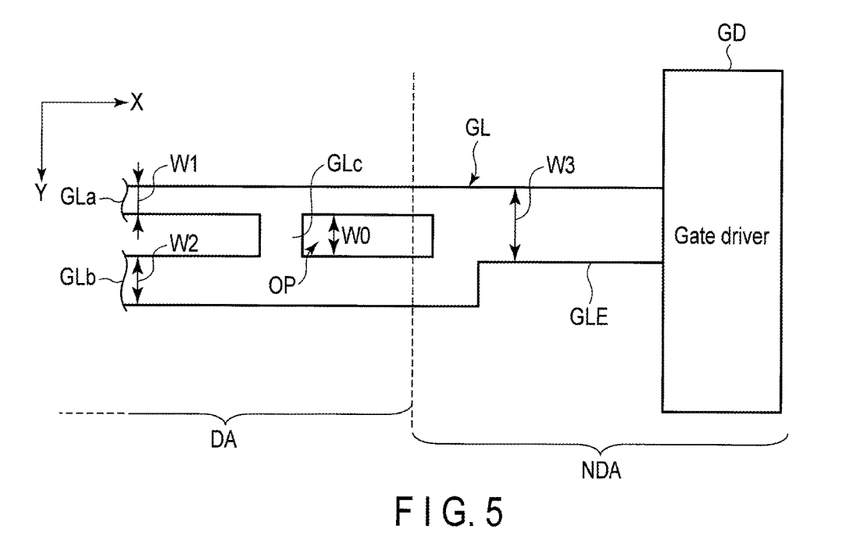
FIG. 5 is an enlarged view of a connection section of a gate line and a gate driver in the display device according to the first embodiment.

FIG. 5 is an enlarged view of the region where the gate driver GD and the gate line GL are connected to each other.

As described above, the gate lines GL are formed into a ladder shape including a first portion GLa, a second portion GLb and a connection portion GLc, in the display area DA. The gate lines GL each include an end GLE connected to the gate driver GD in a non-display area NDA on an outer side of the display area DA. The end GLE may not necessarily be of the same shape as that of the display area DA, but may be formed into a belt-like shape as in the example illustrated. It is preferable that a width W3 of the end GLE along the second direction Y should be greater than at least the width W1 of the first portion GLa and also should have a width greater than or equal to a sum of the width W1 of the first portion GLa and the width W2 of the second portion GLb.

In the example illustrated, the width W2 is greater than the width W1. For example, the width W2 is twice the width W1 or more. Moreover, a width WOP the opening OP along the second direction Y is greater than the width W1.

According to this embodiment, the gate lines GL each comprises the first portion GLa, which constitutes the first gate electrode WG1 and the second gate electrode WG2 of the switching element SW, and the second portion GLb arranged along side the first portion GLa, and in each pixel PX, the first portion GLa and the second portion GLb are connected to each other with the connection portion GLc. With this structure, the width of the transmission path in the gate line GL, which substantially transmits a scanning signal, can be increased and the resistance of the gate line GL can be reduced as compared to the case where the gate line GL is formed linearly only of the first portion GLa. Therefore, even if the signal write time assigned to each gate line GL is shortened, the degradation of the signal, which may be caused by the wiring resistance of the gate lines GL can be suppressed, thereby making it possible to suppress the degradation of display quality.

Moreover, since the gate lines GL each comprise the first portion GLa and the second portion GLb, the resistance of the gate lines GL can be decreased without increasing the width of the first portion GLa. Therefore, the resistance of the gate lines GL can be decreased without increasing the channel length of the thin film transistor which constitutes the switching element SW.

Furthermore, the first portion GLa and the second portion GLb of one gate line GL are continuously formed with respect to a plurality of pixels PX arranged along the first direction X. More specifically, the resistance of the gate lines GL as a whole can be lowered as compared to the structure in which the first portion GLa is not continuously formed in a plurality of pixels, for example, that is, the first portion GLa is divided for each pixel, and the second portion GLb is continuously formed with respect to the pixels PX so that the second portion GLb and the first portion GLa are connected with the connection portion GLc in each pixel PX. In other words, as compared to the case where the first portion GLa is divided for each pixel, the area of the second portion GLb, required to lower the resistance of the gate lines GL can be decreased. As a result, the resistance of the gate lines GL can be lowered while fully maintaining the area of the region which contributes to display.

Second Embodiment

Figure 6:
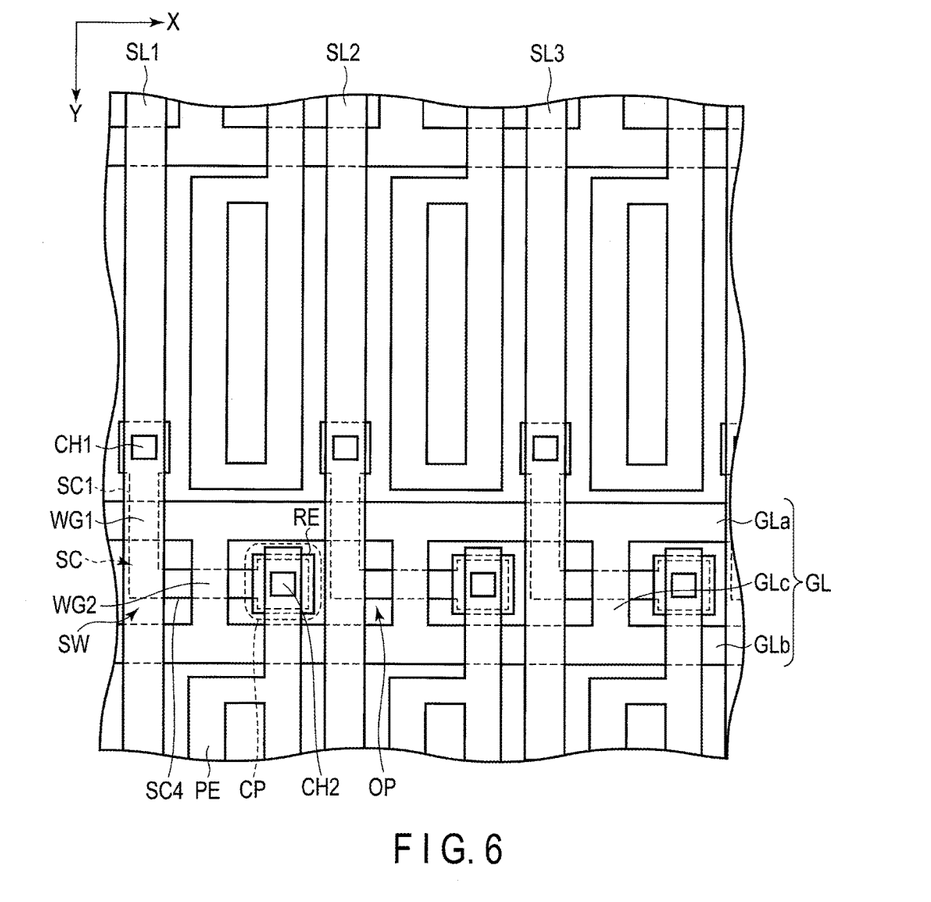
FIG. 6 is a plan view showing an example of a wiring pattern of a display device according to the second embodiment.

FIG. 6 is a plan view showing an example of the wiring pattern of a display device DSP2 according to the second embodiment.

The second embodiment is different from the first embodiment in that semiconductor layer SC of the switching element SW is formed into substantially an L-letter shape. That is, the semiconductor layer SC intersects each of the first portion GLa of the gate line GL and the connection portion GLc. Hereafter, the main differences will be described.

The semiconductor layer SC includes a first region SC1 and a fourth region SC4.

The first region SC1 is extended along the second direction Y under the source line SL1, and intersects the first portion GLa as in the first embodiment. One end of the first region SC1 is electrically connected to the source line SL1 via the contact hole CH1. The other end of the first region SC1 is located between the first portion GLa and the second portion GLb. The first gate electrode WG1 of the switching element SW is equivalent to the region of the first portion GLa, which intersects the first region SC1.

Between the first portion GLa and the second portion GLb, the fourth region SC4 is extended along the first direction X and intersects the connection portion GLc. An end of the fourth region SC4 is connected to the first region SC1. The other end of the fourth region SC4 is located between the connection portion GLc and the source line SL2 and is electrically connected to the pixel electrode PE via the contact hole CH2 and the relay electrode RE. That is, the relay electrode RE is located in the opening OP. The second gate electrode WG2 of the switching element SW is equivalent to the region of the connection portion GLc, which intersects the fourth region SC4.

In this embodiment, the first portion GLa, the second portion GLb and the connection portion GLc are formed to have substantially the same width, but the width of the second portion GLb may be greater than that of the first portion GLa or of the connection portion GLc.

With this embodiment, an advantageous effect similar to that of the first embodiment can be obtained. Moreover, according to this embodiment, a connection portion CP of the pixel electrode PE and the switching element SW is formed between the connection portion GLc and the source line SL and also between the first portion GLa and the second portion GLb. In other words, the connection portion CP is provided in the region where the respective gate line GL is formed. With this configuration, as compared to the case where the connection portion CP is formed outside the region where the gate line is provided, the area of the region which contributes to display can be increased.

Third Embodiment

Figure 7:
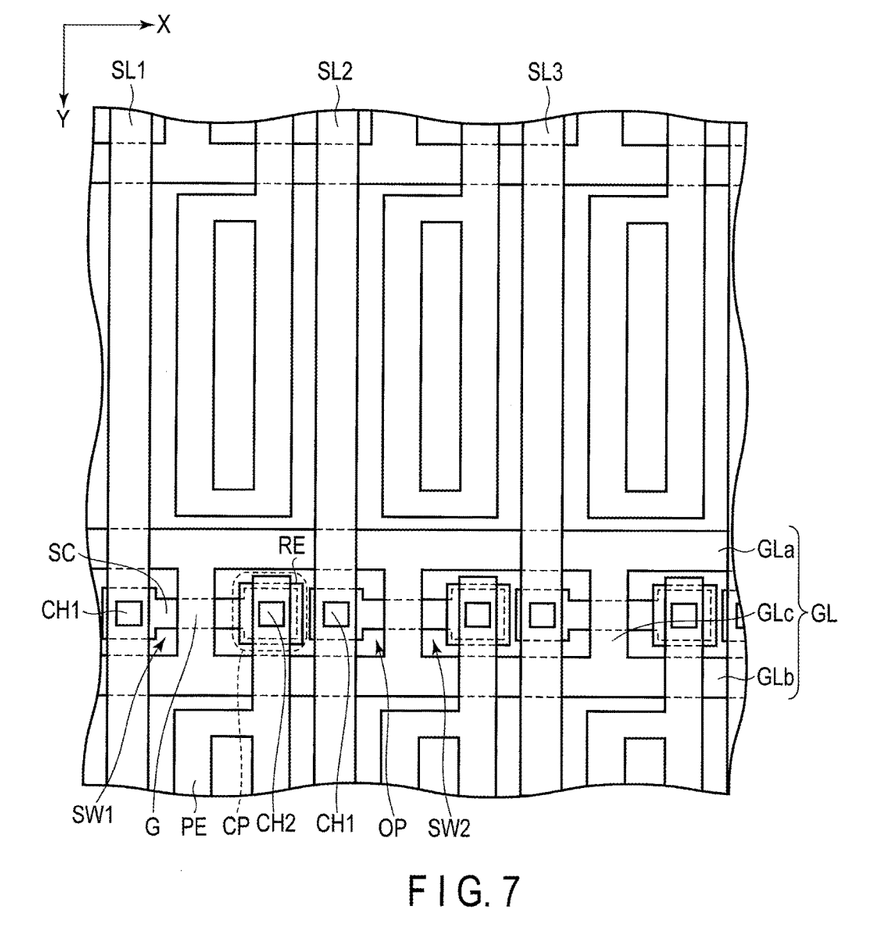
FIG. 7 is a plan view showing an example of a wiring pattern of a display device according to the third embodiment.

FIG. 7 is a plan view schematically showing an example of the wiring pattern of a display device DSP3 according to the third embodiment.

The third embodiment is different from the above-described first or second embodiment in that the switching element SW is a thin film transistor of a single gate structure. Hereinafter, the main differences will be described.

In this embodiment, the semiconductor layer SC is located between the first portion GLa and the second portion GLb and is extended along the first direction X. The semiconductor layer SC intersects only the connection portion GLc between the source lines SL1 and SL2. An end of the semiconductor layer SC is located under the source line SL1 and is electrically connected to the source line SL1 through the contact hole CH1. The other end of the semiconductor layer SC is located between the connection portion GLc and source line SL2 and is electrically connected to the pixel electrode PE via the contact hole CH2 and the relay electrode RE. The gate electrode G of the switching element SW is equivalent to the region of the connection portion GLc, which intersects the semiconductor layer SC. In the example illustrated, the contact hole CH2 formed in the switching element SW1 and the contact hole CH1 formed in the switching element SW2 adjacent to the switching element SW1 along the first direction X are located in the opening OP.

According to this embodiment, with use of the gate lines GL formed into a ladder shape, an advantageous effect similar to that of the first or second embodiment can be obtained also for the thin film transistor of the single gate structure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
    first and second source lines arranged along a first direction;
    a gate line including first and second portions which extend along the first direction and are arranged along a second direction intersecting the first direction, and a connection portion which connects the first portion and the second portion to each other; and
    a semiconductor layer which intersects at least one of the first portion and the connection portion,
    each of the first portion and the second portion intersecting the first and second source lines,
    the connection portion being located between the first source line and the second source line, and
    a width of the second portion in the second direction being greater than that of the first portion.
2. The display device of claim 1, wherein
    the width of the second portion is twice or more greater than that of the first portion.

3. The display device of claim 1, wherein
the semiconductor layer intersects the first portion at two locations.

4. The display device of claim 3, wherein
the semiconductor layer includes a first region extending along the second direction under the first source line and intersecting the first portion, a second region extending along the second direction from between the first source line and the connection portion and intersecting the first portion, and a third region connecting the first region and the second region to each other between the first portion and the second portion.

5. The display device of claim 4, further comprising:
a pixel electrode,
wherein
the first region is electrically connected to the first source line, and
the second region is electrically connected to the pixel electrode between the first source line and the second source line.

6. A display device comprising:
first and second source lines arranged along a first direction;
a gate line including first and second portions which extend along the first direction and are arranged along a second direction intersecting the first direction, and a connection portion which connects the first portion and the second portion to each other; and
a semiconductor layer which intersects at least one of the first portion and the connection portion,
each of the first portion and the second portion intersecting the first and second source lines,
the connection portion being located between the first source line and the second source line, and
the semiconductor layer intersecting each of the first portion and the connection portion at one location.

7. The display device of claim 6, wherein
the semiconductor layer includes a first region extending along the second direction under the first source line and intersecting the first portion and a second region connected to the first region, extending along the first direction between the first portion and the second portion and intersecting the connection portion.

8. The display device of claim 7, further comprising:
a pixel electrode,
wherein
the first region is electrically connected to the first source line, and
the second region is electrically connected to the pixel electrode between the connection portion and the second source line.

9. A display device comprising:
first and second source lines arranged along a first direction;
a gate line including first and second portions which extend along the first direction and are arranged along a second direction intersecting the first direction, and a connection portion which connects the first portion and the second portion to each other; and
a semiconductor layer which intersects at least one of the first portion and the connection portion,
each of the first portion and the second portion intersecting the first and second source lines,
the connection portion being located between the first source line and the second source line, and
the semiconductor layer intersecting the connection portion at one location.

10. The display device of claim 9, wherein
the semiconductor layer extends out along the first direction between the first portion and the second portion,
one end of the semiconductor layer is located under the first source line,
another end of the semiconductor layer is located between the second source line and the connection portion.

11. The display device of claim 10, further comprising:
a pixel electrode,
wherein
the one end is electrically connected to the first source line, and
the another end is electrically connected to the pixel electrode.

12. A display device comprising:
first and second source lines arranged along a first direction;
a gate line including first and second portions which extend along the first direction and are arranged along a second direction intersecting the first direction, and a connection portion which connects the first portion and the second portion to each other;
a semiconductor layer which intersects at least one of the first portion and the connection portion; and
a first pixel electrode and a second pixel electrode adjacent to each other along the second direction between the first source line and the second source line,
each of the first portion and the second portion intersecting the first and second source lines,
the first portion and the second portion being located between the first pixel electrode and the second pixel electrode, and
the connection portion being located between the first source line and the second source line and between the first pixel electrode and the second pixel electrode.

13. The display device of claim 12, wherein
an interval between the first portion and the second portion in the second direction is less than a length of the first pixel electrode.

14. A display device comprising:
first, second and third source lines arranged along a first direction; and
a gate line including first and second portions which extend along the first direction and are arranged along a second direction intersecting the first direction, and a first connection portion and a second connection portion which connect the first portion and the second portion to each other,
the first connection portion being located between the first source line and the second source line,
the second connection portion being located between the second source line and the third source line, and
a pitch of the first connection portion and the second connection portion being equal to that of the first source line and the second source line.

15. The display device of claim 14, wherein
the gate line includes an opening elongated in the first direction between the first connection portion and the second connection portion.

16. The display device of claim 15, wherein
a width of the opening in the second direction is greater than that of the first portion.

17. The display device of claim 15, further comprising:
a semiconductor layer;
wherein the semiconductor layer at least partially overlaps the opening.

* * * * *